(12) United States Patent
Ma

(10) Patent No.: US 8,570,081 B2
(45) Date of Patent: *Oct. 29, 2013

(54) FAST MEASUREMENT INITIALIZATION FOR MEMORY

(75) Inventor: Yantao Ma, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/541,113

(22) Filed: Jul. 3, 2012

(65) Prior Publication Data
US 2012/0274374 A1 Nov. 1, 2012

Related U.S. Application Data

(63) Continuation of application No. 13/088,946, filed on Apr. 18, 2011, now Pat. No. 8,217,695, which is a continuation of application No. 11/566,626, filed on Dec. 4, 2006, now Pat. No. 7,928,781.

(51) Int. Cl.
 *H03L 7/06* (2006.01)
(52) U.S. Cl.
 USPC .......................................... 327/158

(58) Field of Classification Search
 USPC .............................................. 327/158
 See application file for complete search history.

(56) References Cited

U.S. PATENT DOCUMENTS

| | | | |
|---|---|---|---|
| 7,046,060 B1 | 5/2006 | Minzoni et al. | |
| 7,388,415 B2 | 6/2008 | Lee | |
| 7,928,781 B2 | 4/2011 | Ma | |
| 2001/0028266 A1 | 10/2001 | Taniguchi | |
| 2003/0001650 A1* | 1/2003 | Cao et al. | 327/277 |
| 2005/0157684 A1 | 7/2005 | Ylitalo et al. | |
| 2006/0279342 A1 | 12/2006 | Blodgett | |
| 2011/0193603 A1 | 8/2011 | Ma | |

* cited by examiner

*Primary Examiner* — Daniel Rojas
(74) *Attorney, Agent, or Firm* — Knobbe, Martens, Olson & Bear, LLP

(57) ABSTRACT

Systems and methods for synchronization of clock signals are disclosed. In a feedback system such as a delay-lock loop circuit, delays to be applied can be determined adaptively based on a phase difference between a reference signal and a clock signal being delayed. Such adaptive decisions can be made during each feedback cycle, thereby making it possible to achieve a phase lock faster and more efficiently. In some embodiments, such adaptive functionality can be incorporated into existing circuits with minimal impact.

20 Claims, 6 Drawing Sheets

FAST MEASUREMENT INITIALIZATION FOR MEMORY

This application is a continuation of U.S. patent application Ser. No. 13/088,946, filed Apr. 18, 2011, which is a continuation of U.S. patent application Ser. No. 11/566,626, filed Dec. 4, 2006, now U.S. Pat. No. 7,928,781, the entireties of which are hereby incorporated herein by reference to be considered a part of this specification.

BACKGROUND

1. Field

The present disclosure generally relates to synchronizing clock signals in electronic devices, and more particularly, to systems and methods for adaptively determining phase shifts during phase-locking feedback loops.

2. Description of the Related Art

Many electronic devices operate based on clock signals. In some situations, it becomes necessary for one clock signal to be synchronized with another clock signal. Typically, such synchronization is achieved by a feedback scheme, where a delay is provided to one signal repeatedly during multiple cycles until the phase of that signal becomes "locked" with the phase of the other signal. A delay-locked loop (DLL) is an example of such a feedback phase-locking circuit.

In situations where the phase difference is initially large, such synchronization can require a large number of feedback cycles to achieve phase-lock. Such large number of cycles can require longer time to achieve synchronization of clock signals. In many electronic devices such as memory devices, where clock synchronization is performed during device initialization, such long initialization time is typically not desirable.

BRIEF DESCRIPTION OF THE DRAWINGS

These and other aspects, advantages, and novel features of the present teachings will become apparent upon reading the following detailed description and upon reference to the accompanying drawings. In the drawings, similar elements have similar reference numerals.

DETAILED DESCRIPTION OF EMBODIMENTS OF THE INVENTION

Figure 1:
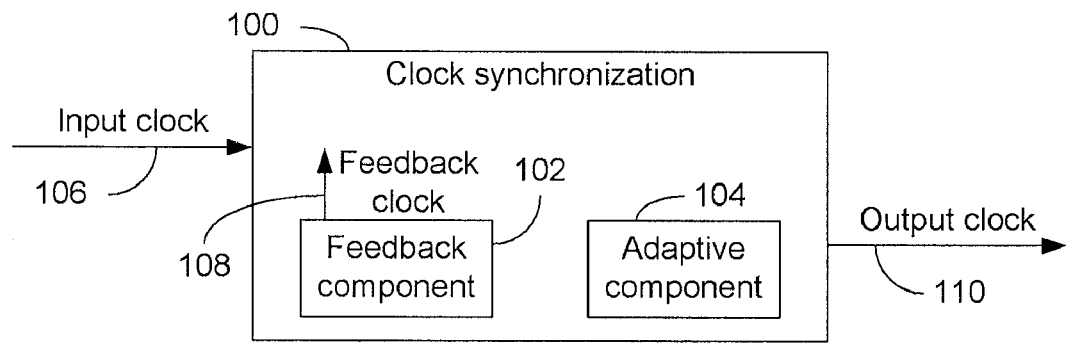
FIG. 1 shows a block diagram of one embodiment of a clock synchronization system configured to synchronize an output clock signal with an input clock signal via a feedback component and a adaptive adjustment component.

The present disclosure generally relates to systems and methods for synchronizing clock signals. FIG. 1 shows that in one embodiment, a clock synchronization component 100 can be configured to synchronize an output clock signal 110 to an input clock signal 106. In one embodiment, such synchronization can be achieved via a feedback component 102 that compares the output clock signal 110 with the input signal 106 (via a feedback clock signal 108), so as to allow further adjustment or determination that the two signals are synchronized.

In one embodiment, as further shown in FIG. 1, the clock synchronization component 100 can include an adaptive adjustment component 104 that can provide adjustments depending on the comparison of the input and output clock signals 106 and 110. As described herein, such adaptive adjustments can allow for faster and/or more efficient synchronization of two clock signals. Various features of such adaptive adjustments are described below in greater detail.

Figure 2:
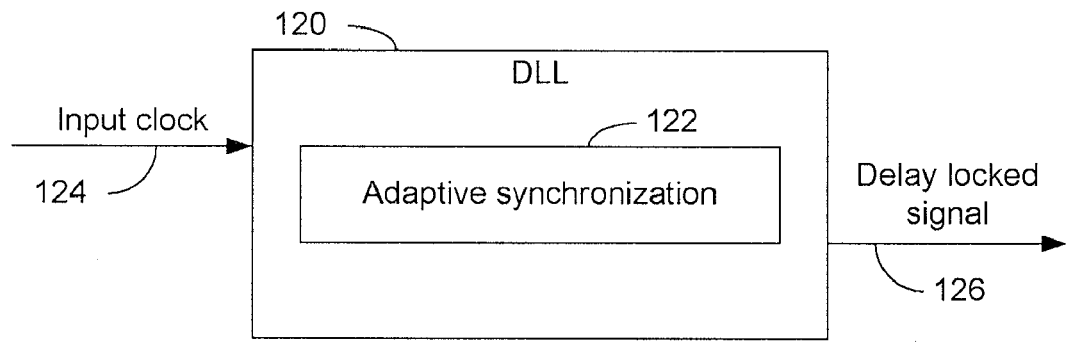
FIG. 2 shows that in one embodiment, the adaptive clock synchronization system of FIG. 1 can be implemented in a delay-locked loop (DLL) system.

FIG. 2 shows that in one embodiment, the clock synchronization component 100 of FIG. 1 can be implemented in a delay-locked loop (DLL) component 120. Thus, an adaptive synchronization component 122 can be configured so as to provide adaptive adjustments that can result in an output delay locked clock signal 126 that is substantially synchronized with an input clock signal 124.

Figure 3:
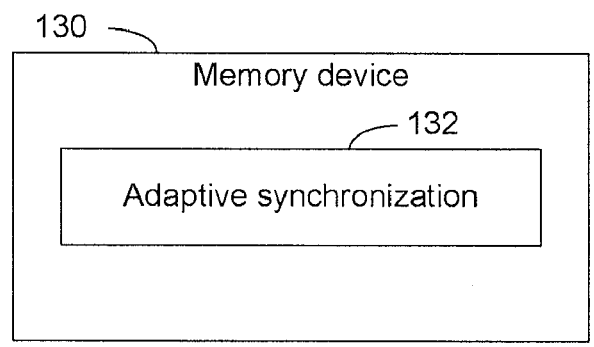
FIG. 3 shows that in one embodiment, a DLL system having the adaptive clock synchronization system can be implemented in a memory device.

FIG. 3 shows that in one embodiment, clock synchronization techniques such as the DLL technique can be implemented in a memory device 130. As shown, an adaptive synchronization component 132 can provide adaptive adjustments that can result in faster and/or more efficient clock synchronizations.

In some embodiments, high speed DLL locking of clock signals can be important for various performance parameters such as memory performance, reduced latency, timing margin, fast data throughput, and the like. Maintaining or improving such performance parameters can be important as clock frequency becomes smaller and varies in a relatively wide range.

In some embodiments, various techniques of the present disclosure can be implemented in various forms of dynamic random access memory (DRAM) devices, including DDR3 and DDR4 (double-data-rate) versions. It will be understood, however, that various techniques of the present disclosure can also be implemented in other types of memory devices. Moreover, the adaptive clock synchronization techniques of the present disclosure can be implemented in non-memory electronic devices as well.

Figure 4:
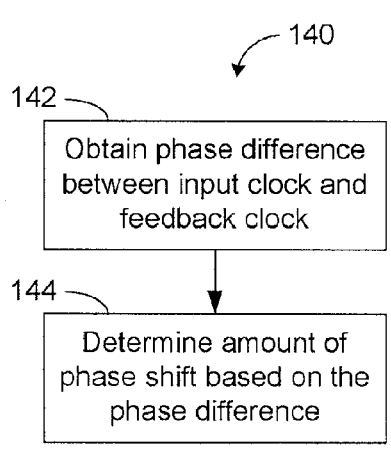
FIG. 4 shows one embodiment of a process that can be performed by the adaptive clock synchronization system of FIG. 1.

FIG. 4 shows one embodiment of a process 140 that can be performed by the adaptive component 104 of the clock synchronization component 100 of FIG. 1. In a process block 142, a phase difference between an input clock signal and a feedback clock signal is obtained. In one embodiment, the feedback clock signal can be obtained from the output clock signal via the feedback component 102 (FIG. 1). In a process block 144, the process 140 determines an amount of phase adjustment to be applied, based on the phase difference.

Figure 5:
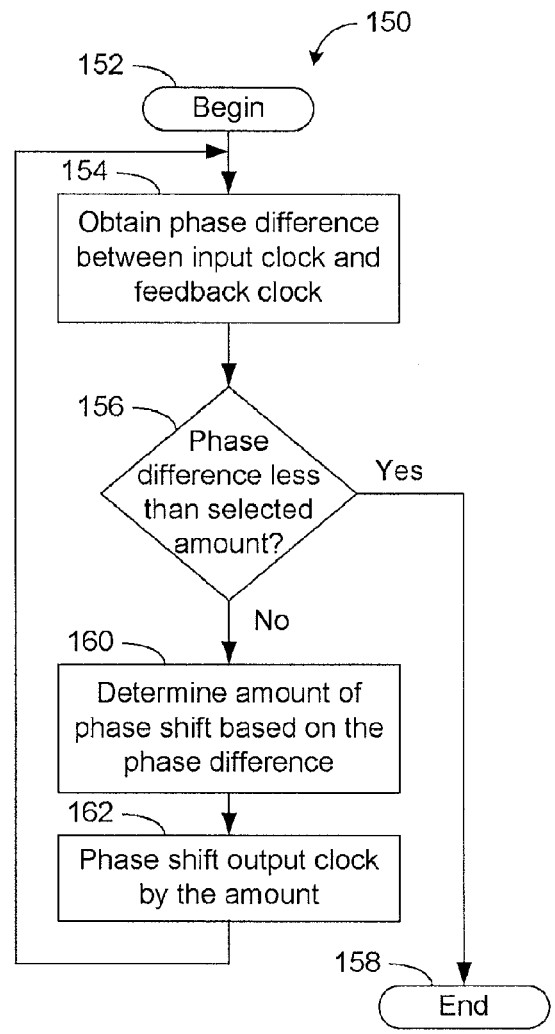
FIG. 5 shows one embodiment of a process that can incorporate the adaptive phase adjustment process of FIG. 4.

FIG. 5 shows one embodiment of a process 150 where the adaptive phase adjustment process 140 of FIG. 4 can be performed iteratively so as to achieve a lock between the input and output clock signals. The process 150 is shown to start at a begin state 152. In a process block 154, a phase difference between an input clock signal and a feedback clock signal is obtained. In a decision block 156, the process 150 determines whether the phase difference is less than a selected amount. In one embodiment, the two clock signals can be considered to be locked and synchronized if their phase difference is less than the selected amount. Thus, if the answer is "Yes," the process 150 ends at an end state 158. If the answer is "No," the process 150 in a process block 160 determines an amount of phase adjustment based on the phase difference. In a process block 162, the process 150 either shifts or facilitates shifting of phase of the output clock signal by the amount determined in the process block 160.

As shown in FIG. 5, the process 150 can then loop back to the process block 154, where a new phase difference between the feedback and the input clock signals is obtained. Another adjustment based on the new difference can be performed in a manner as described above.

Base on the foregoing, one can see that each phase comparison can provide an adjustment value based on that comparison, and not on some static value. Thus, the phase difference between two clock signals can be narrowed down relatively rapidly and efficiently. For example, if the initial phase comparison shows a large difference, the initial phase adjustment can be made accordingly large instead of a series of fixed adjustments. The next comparison will likely show that the phase difference has now been narrowed to a small value. Accordingly, the next phase adjustment can be made small. The phase difference can be further narrowed in a similar manner until it is determined that the two signals can be considered to be synchronized.

Figure 6:
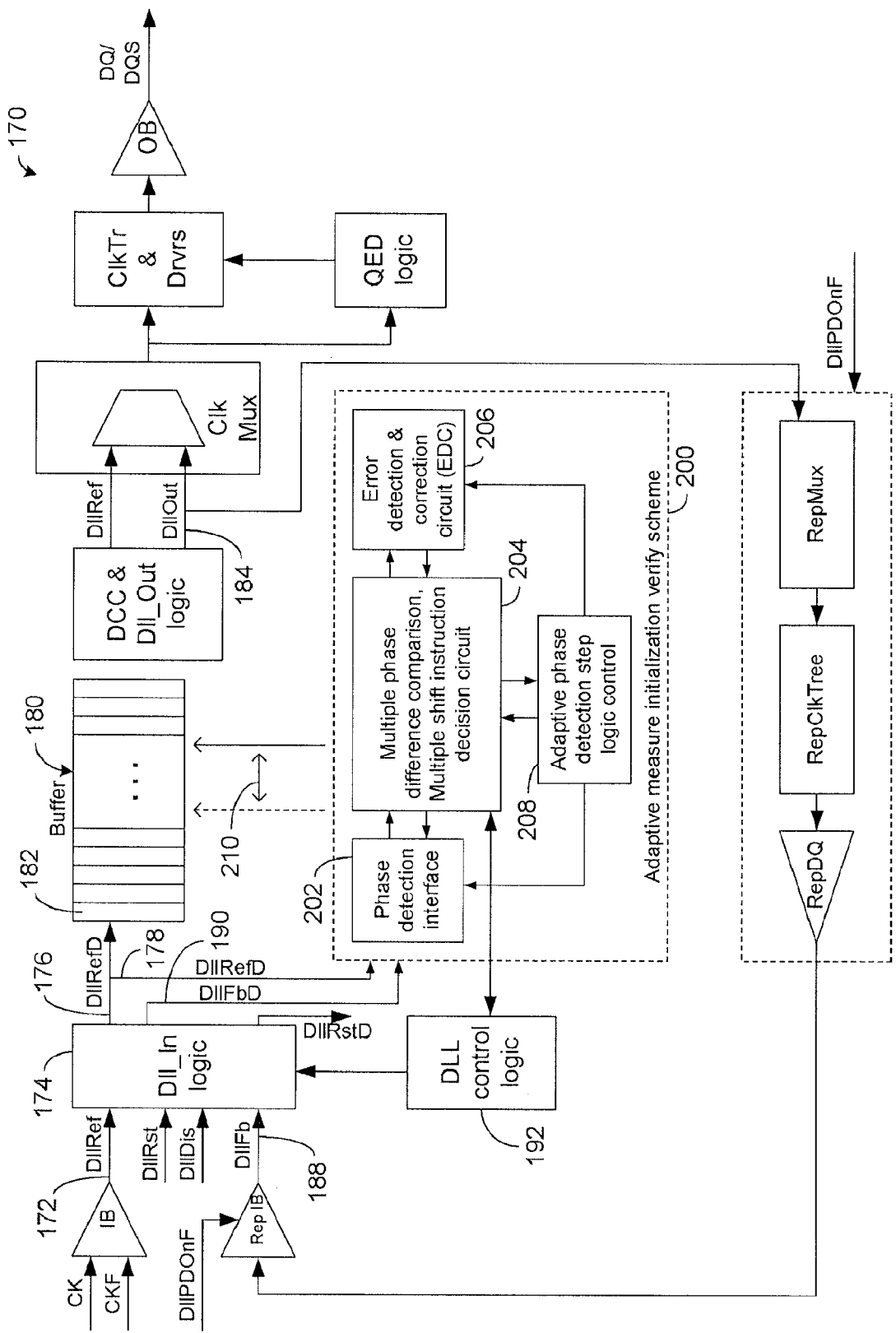
FIG. 6 shows one embodiment of an example DLL-based clock synchronization system that can be implemented in devices such as a memory device.

FIG. 6 shows one embodiment of a clock synchronization system 170 that can be implemented in a DLL circuit. As previously described, such a circuit can be implemented in memory devices to facilitate faster locking of clock signals.

In one embodiment, a reference clock signal "DllRef" 172 is shown to be input into a logic circuit 174 along with a feedback clock signal "DllFb" 188 that represents a feedback signal which is being adjusted to lock on the reference clock signal 172 as a delay version of a clock signal 184. A reference clock signal "DllRefD" 176 can include an intrinsic delay introduced to the reference clock signal "DllRef" 172 in the logic circuit 174. Similarly, a feedback clock signal "DllFbD" 190 can include an intrinsic delay introduced to the feedback clock signal "DllFb" 188 in the logic circuit 174.

As shown, the reference clock signal "DllRefD" 176 can provide a reference for a delay buffer 180 that allows delaying of an output clock signal 184. Such delaying can be based on determination, by a phase detection component 202, of a phase difference between the reference clock signal 178 and the feedback clock signal 190. The feedback clock signals 188 and 190 can be obtained from the output clock signal 184 in a known manner.

In one embodiment, as shown in FIG. 6, the delay buffer 180 can include a plurality of delay units 182. If a given delay to be applied involves N delay units, then it will take N feedback cycles to accomplish the delay if one delay unit is applied during each cycle. In situations where one delay unit represents the resolution of the applied delay, the resolution can be improved by decreasing the delay unit size. This will result in more delay units to achieve the given delay for the clock signal.

Thus, in one embodiment, multiple delay units can be applied during each feedback cycle. In one embodiment, the number of delay units to be applied can change (depicted as an arrow 210) for each feedback cycle. An example of adaptively changing the number of delay units is described below in greater detail.

In some DLL designs, the delay units 182 can include a plurality of one type of fixed delay units. Thus, multiples of such delay units can be applied during a given feedback cycle. In some DLL designs, the delay units 182 can include a plurality of fixed coarse delay units and a plurality of fixed fine delay units. In some embodiments, the coarse and fine delay units can be configured in different ways. In one embodiment, the delay units 182 can include a series of delay units with each unit having one or more coarse units followed by one or more fine units. In another embodiment, the delay units 182 can include a series of delay units having one or more coarse units followed by one or more half-coarse units, followed by a delay unit having a plurality of fine units. In another embodiment, the delay units 182 can include a plurality of coarse units followed by a delay unit having a plurality of fine units. Other configurations are possible. Thus, multiples of the coarse units and/or fine units can be applied during a given cycle. Moreover, fractions of the coarse unit can be applied by applying a multiple of the fine unit.

As shown in FIG. 6, such adaptive application of delays can be facilitated by an adaptive component 200. In one embodiment, the adaptive component 200 can include the phase detection component 202 configured to determine the phase difference between the reference and feedback clock signals 178 and 190. Such detected phase difference can be a basis for adaptively determining (by a decision component 204) the amount of delay to be applied. In one embodiment, such delay to be applied can involve multiple delay units.

In one embodiment, the decision component 204 can be in communication with a DLL control logic component 192 for controlling of the logic circuit 174.

In one embodiment, the decision component 204 can also include an error detection and correction component 206. The error correction component 206 can be configured to detect an increase in the phase difference between the reference signal 178 and the feedback signal 190 (due to, for example, jitters in either or both signals). The error correction component 206 can further be configured to either increase the delay or maintain a given delay to account for such increase in the phase difference.

In one embodiment, operations of the phase detection component 202, decision component 204, and the EDC component 206 can be under the control of a control component 208 so as to effectuate the adaptively determined delay adjustment 210 involving one or more delay units 182.

In some embodiments, various functionalities of the adaptive component 200 can be implemented on existing DLL systems with minimal impact without having to restructure the delay buffer configuration 180. For example, in DLL systems having the delay units 182, different delay adjustments can be effectuated by issuing different multiple-shift commands during the feedback cycles, with each command involving multiples of the existing delay unit 182. Thus, a multiple-shift command can be issued during a given feedback cycle; and a different multiple-shift can be issued during the next feedback cycle.

In one embodiment, the minimum impact on existing DLL designs can involve adding of one extra port routing to the upper level configuration. Thus, in the example DLL circuit shown in FIG. 6, the adaptive component 200 can be incorporated into an existing feedback logic control circuit.

Figure 7:
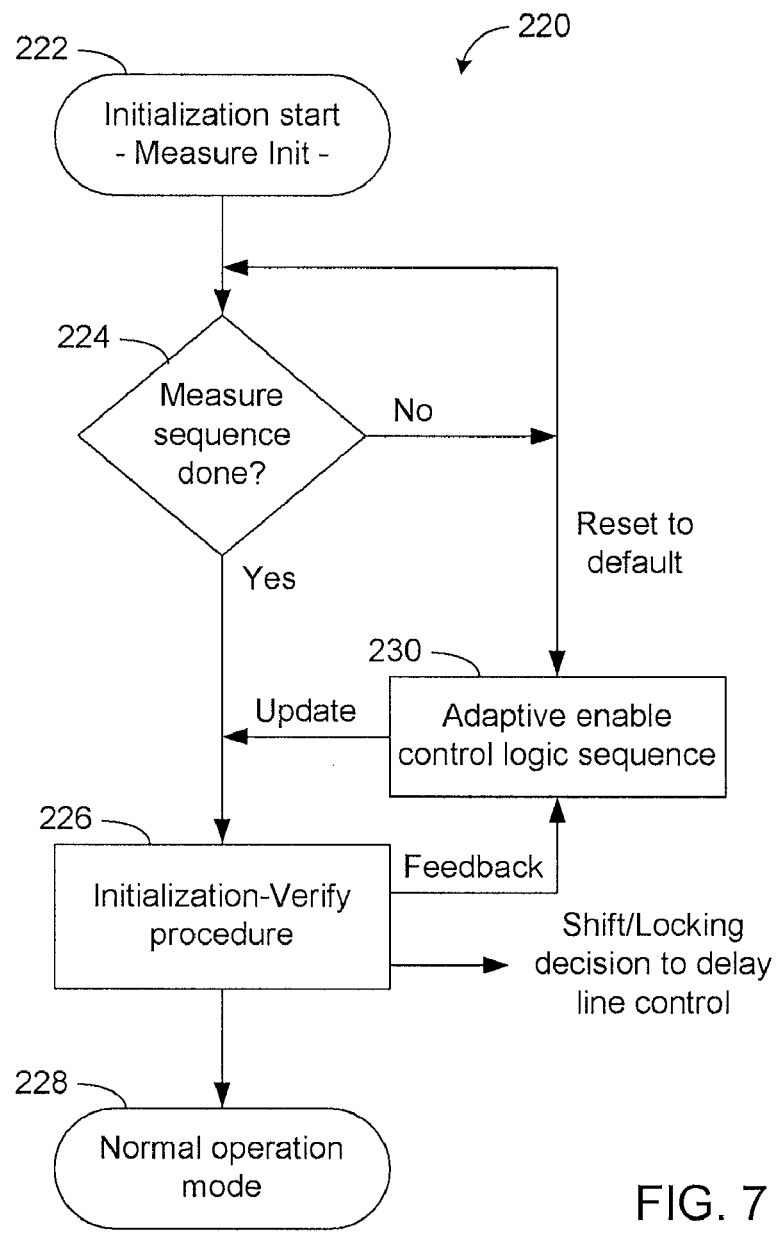
FIG. 7 shows one embodiment of a process that can be performed during an initialization of a memory device.

FIG. 7 shows one embodiment of a process 220 that can be implemented, for example, in the example system 170 of FIG. 6. In one embodiment, such clock synchronization can be performed during an initialization stage of a memory device. Thus, the process 220 is shown to begin in an initialization start state 222.

In a decision block 224, the process 220 determines whether the initial phase measurement sequence has been performed. If the answer is "No," the process 220 continues to perform the phase measurement sequence (not shown) and checks for completion at a later time (indicated by looping back to the decision block 224). If the answer is "Yes," the process 220 proceeds to perform a feedback procedure that includes an initialization-verify procedure (process block 226) and an adaptive control logic sequence (process block 230).

As shown, the adaptive control logic sequence 230 can be initially reset to a default configuration (for example, initially and/or when the process 220 determines that the measure sequence has not been performed). An example of such default configuration is described below in greater detail.

As shown, the adaptive control logic sequence 230 provides an update of its current control parameters to the initialization-verify procedure 226. In one embodiment, the initialization-verify procedure 226 determines how much phase adjustment should be made based on the control parameters and the phase difference. An example of the initialization-verify procedure 226 is described below in greater detail.

In one embodiment, the determination of the initialization-verify procedure 226 can be provided to the adaptive control logic sequence 230 as a feedback to allow updating of the control parameters. An example of such feedback is described below in greater detail.

In one embodiment, the result of the initialization-verify procedure 226 can be implemented to provide a shift/locking decision for delaying the clock signal. In one embodiment, the clock signal can be delayed after each initialization-verify procedure 226. In one embodiment, the clock signal can be adjusted by a collective amount determined by one or more feedback cycles in the adaptive control procedure.

In one embodiment, the process 220 can perform its normal operations (state 228) upon determination that the phase of the adjusted clock signal is within some selected window relative to the phase of the reference signal.

Figure 8:
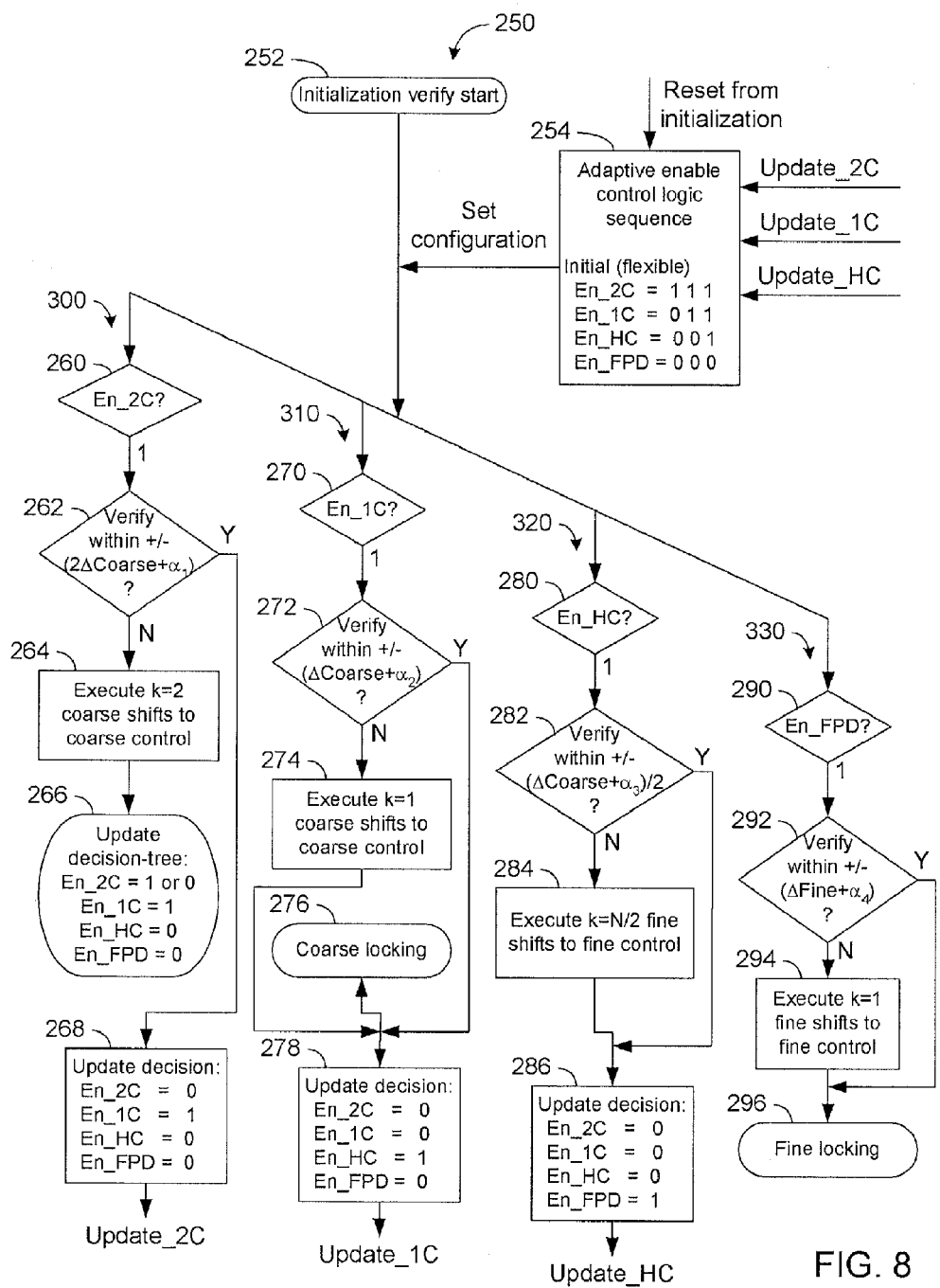
FIG. 8 shows one embodiment of an example process that can perform the initialization of FIG. 7 by using different phase adjustments depending to achieve a faster phase lock.

FIG. 8 shows one embodiment of an example process 250 that can perform the adaptive control and initialization procedures described above in reference to FIG. 7. For the purpose of description, the process 250 is shown to begin at an initialization-verify start state 252.

An adaptive enable control logic sequence (process block 254) is shown to provide a set of control parameters. Example parameters En_2C, En_1C, En_HC, and En_FPD can be reset to initial values and updated as shown. For the purpose of description, "2C" refers to twice (two-times) the coarse adjustment value ($\Delta$Coarse), "1C" refers to one-times $\Delta$Coarse, "HC" refers to half of $\Delta$Coarse, and "FPD" refers to fine phase delay value ($\Delta$Fine).

In one embodiment, each of the control parameters can include a bit pattern that either enables its corresponding adjustment. For example, the initial bit pattern for En_2C is shown to be "1 1 1," indicating that En_2C should be enabled for the three example rounds of adaptive control loop. The example initial bit pattern for En_1C is shown to be "0 1 1," indicating that En_1C should be disabled for the first round and enabled for the remaining two rounds. The example initial bit pattern for En_HC is shown to be "0 0 1," indicating that En_0C. should be disabled for the first two rounds and enabled for the last round. The example initial bit pattern for En_FPD is shown to be "0 0 0," indicating that En_FPD should be disabled for the first three rounds.

In the example initial configuration of "1 1 1" for En_2C, this largest adjustment (in this particular example) adjustment value is enabled throughout the first three rounds so as to allow for possible large adjustments in the event the phase difference is relatively large. Similarly, the example initial configuration of "0 1 1" for En_1C, the lesser coarse adjustment value remains enabled in the third round so as to allow for possible "1C" adjustment during the third round. As shown in FIG. 8, however, these initial configurations can be changed adaptively, depending on the comparison of the phases between the reference and clock signals.

As shown in FIG. 8, the process 250 can evaluate a shift to be made based on a given set of enablement configuration from the adaptive enable control logic 254. Thus, initially, a process branch 300 is invoked because only En_2C is enabled. In subsequent round(s), a process branch 310 is invoked if En_1C is enabled. Similarly, process branches 320 and 330 are invoked if their respective En_HC and En_FPD are enabled.

In one embodiment, the process branch 300 can include a determination (decision block 260) of whether En_2C is enabled. If the answer is "Yes" ("1"), the process 250 determines (in a decision block 262) whether the measured phase difference is within a selected window. In one embodiment, the selected window can be defined as $+/-(2\Delta\text{Coarse}+\alpha_1)$, where $\alpha_1$ represents a window parameter (or hysteresis) that can be selected aside from the adjustment value (2$\Delta$Coarse in this case). In one embodiment, setting the window to be wider than 2$\Delta$Coarse (by $\alpha_1$) can ensure that an adjustment by 2$\Delta$Coarse will not over-compensate.

If the answer is "Yes" in the decision block 262, the phase difference is considered to be less than the window size and not needing a "2C" adjustment. Thus, in a process block 268, updated configuration for the next round is set. Here, En_2C is set to "0" since it was determined that "2C" adjustment is not needed. En_1C is set to "1" since "1C" is the next level of granularity in adjustment. En_HC and En_FPD are set to "0" since it is likely that at least one "1C" adjustment will need to be made.

If the answer is "No" in the decision block 262, the process 250 (in a process block 264) can perform a "2C" adjustment. In one embodiment, the process 250 can execute or send instruction to execute k=2 coarse shifts, where k represents an integer number. Thus, in this example, two (k=2) coarse shifts (with each coarse shift corresponding to $\Delta$Coarse) are effectuated.

As shown in FIG. 8, the process 250 (in a process block 266) updates the decision configuration for the next round. En_2C can be set to "1" or "0," depending on the phase difference. En_1C is set to "1" since "1C" is the next level of granularity in adjustment. En_HC and En_FPD are set to "0" since it is likely that at least one "1C" adjustment will need to be made.

In one embodiment, the process branch 310 can include a determination (decision block 270) of whether En_1C is enabled. If the answer is "Yes" ("1"), the process 250 determines (in a decision block 272) whether the measured phase difference is within a selected window. In one embodiment, the selected window can be defined as $+/-(\Delta\text{Coarse}+\alpha_2)$, where $\alpha_2$ represents a window parameter that can be selected aside from the adjustment value ($\Delta$Coarse in this case). In one embodiment, setting the window to be wider than $\Delta$Coarse (by $\alpha_2$) can ensure that an adjustment by $\Delta$Coarse will not over-compensate.

If the answer is "Yes" in the decision block 272, the phase difference is considered to be less than the window size and not needing a "1C" adjustment. Thus, in a process block 278, updated configuration for the next round is set. Here, En_2C is set to "0" since it was determined that "2C" adjustment is not needed. En_1C is also set to "0" since it was determined that "1C" adjustment is not needed. En_HC is set to "1" since "HC" is the next level of granularity in adjustment. En_FPD is set to "0" since it is likely that at least one "HC" adjustment will need to be made. In one embodiment, as shown in FIG. 8, the completion of the "1C" level of adjustment can be considered to have achieved a coarse locking of the clock signal (in a state 276).

If the answer is "No" in the decision block 272, the process 250 (in a process block 274) can perform a "1C" adjustment. In one embodiment, the process 250 can execute or send instruction to execute k=1 coarse shift, where k represents an integer number. Thus, in this example, one (k=1) coarse shift (with each coarse shift corresponding to ΔCoarse) is effectuated.

As shown in FIG. 8, the process 250 can update the decision configuration for the next round in a manner described above in reference to the process block 278. In this example, En__1C is set to "0" since the remaining phase difference will likely be less than ΔCoarse at this stage.

In one embodiment, the process branch 320 can include a determination (decision block 280) of whether En_HC is enabled. If the answer is "Yes" ("1"), the process 250 determines (in a decision block 282) whether the measured phase difference is within a selected window. In one embodiment, the selected window can be defined as $+/-(\Delta Coarse+\alpha_3)/2$, where $\alpha_3$ represents a window parameter that can be selected aside from the adjustment value (ΔCoarse/2 in this case). In one embodiment, setting the window to be wider than ΔCoarse/2 (by $\alpha_3/2$) can ensure that an adjustment by ΔCoarse/2 will not over-compensate.

If the answer is "Yes" in the decision block 282, the phase difference is considered to be less than the window size and not needing a "HC" adjustment. Thus, in a process block 286, updated configuration for the next round is set. Here, En__2C, En__1C, and En_HC are set to "0" since it was determined that these coarser adjustments or the current "HC" adjustment are not needed. En_FPD is set to "1" since "FPD" is the next level of granularity in adjustment.

If the answer is "No" in the decision block 282, the process 250 (in a process block 284) can perform a "HC" adjustment. In one embodiment, the process 250 can execute or send instruction to execute k=N/2 fine shifts, where k represents an integer number, and N represents an even integer number. In one embodiment, the coarse and fine adjustments can be selected so that ΔCoarse is an even multiple of ΔFine. Thus, in this example, N/2 fine shifts (with each fine shift corresponding to ΔFine) are effectuated.

As shown in FIG. 8, the process 250 can update the decision configuration for the next round in a manner described above in reference to the process block 286. In this example, En_HC is set to "0" since the remaining phase difference will likely be less than ΔCoarse/2 at this stage.

In one embodiment, the process branch 330 can include a determination (decision block 290) of whether En_FPD is enabled. If the answer is "Yes" ("1"), the process 250 determines (in a decision block 292) whether the measured phase difference is within a selected window. In one embodiment, the selected window can be defined as $+/-(\Delta Fine+\alpha_4)$, where $\alpha_4$ represents a window parameter that can be selected aside from the adjustment value (ΔFine in this case). In one embodiment, setting the window to be wider than ΔFine (by $\alpha_4$) can ensure that an adjustment by ΔFine will not over-compensate.

If the answer is "Yes" in the decision block 292, the phase difference is considered to be less than the window size and not needing a "FPD" adjustment. Thus, the process 250 can determine (in a state 296) that a fine locking has been achieved.

If the answer is "No" in the decision block 292, the process 250 (in a process block 294) can perform a "FPD" adjustment. In one embodiment, the process 250 can execute or send instruction to execute k=1 fine shift, where k represents an integer number. Thus, in this example, one fine shift (with each fine shift corresponding to ΔFine) is effectuated.

As shown in FIG. 8, the process 250 can determine that fine locking has been achieved in the state 296.

In one embodiment, the process 250 can also include a functionality where updating of configurations for the next feedback cycle can include enabling a larger time delay. Such a larger time delay may be desired if there is an increase in the phase difference (for example, due to jitters in the clock signal and/or reference signal, or reference clock signal frequency changes). Thus, it will be understood that while the example in FIG. 8 shows the example delays becoming successively smaller, the adaptive configuring of the delays can also include one or more delays becoming larger. In one embodiment, such a functionality can be implemented in the error detection and correction component 206 described above in reference to FIG. 6.

Figure 9:
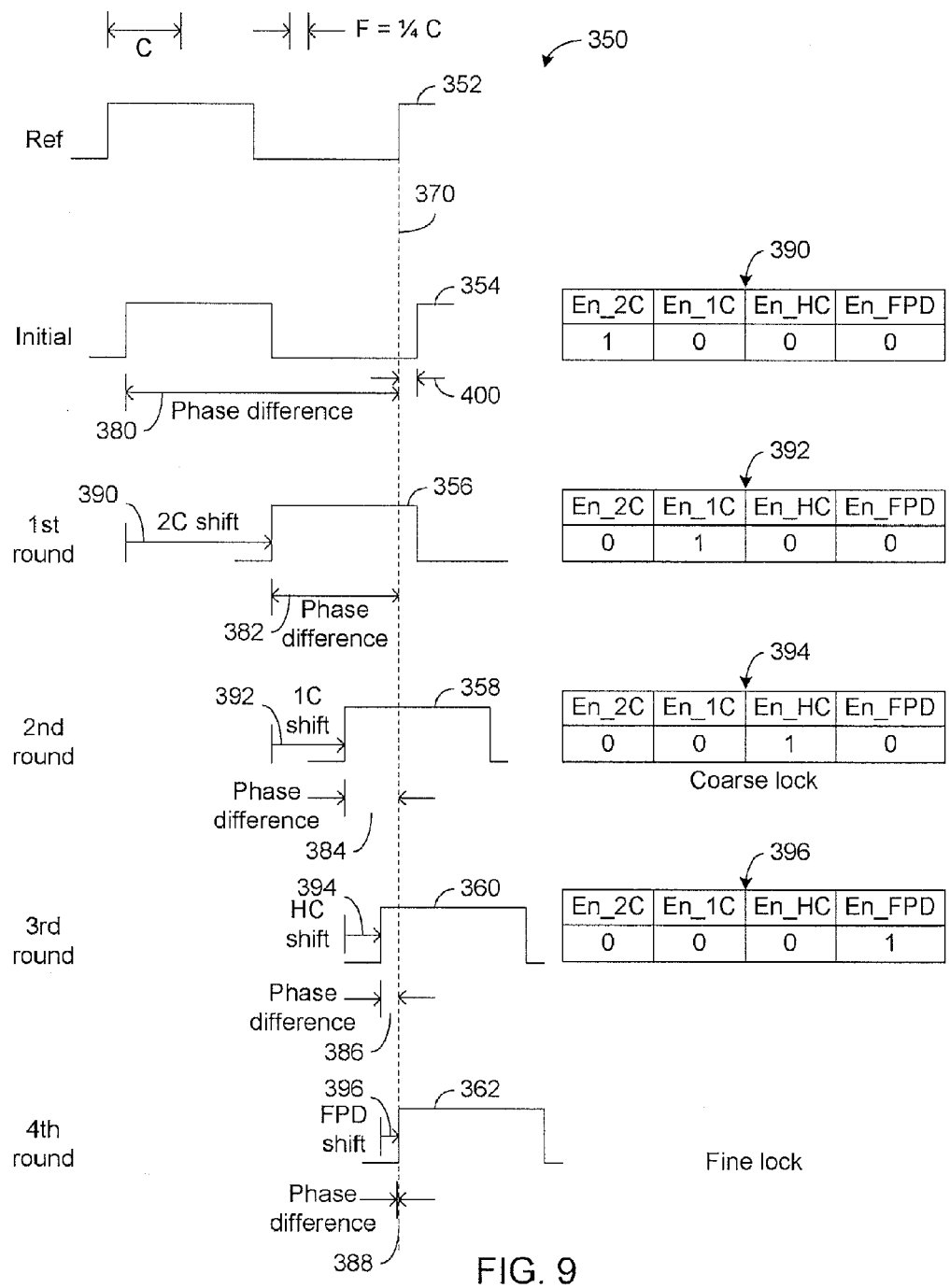
FIG. 9 shows an example phase locking sequence that can be performed by the example process of FIG. 8.

FIG. 9 shows an example phase locking sequence 350 that can be performed by the example process 250 of FIG. 8. In the example, a coarse adjustment value "C" is selected to be about a quarter of a period of a reference clock signal 352. An example fine adjustment value "F" is selected to be about a quarter of C.

For the purpose of description, it will be assumed that delays are being added to a clock signal to bring its phase closer to that of the reference clock signal 352. In some situations, however, some or all of the delay units (for example, 182 in FIG. 6) may already be enabled when the initial phase difference (depicted as 380 in FIG. 9) is determined. In such situations, phase locking can also be achieved by removing delay unit(s) so as to adjust the complementary phase difference (depicted as 400 in FIG. 9). In one embodiment, a determination as to which type of adjustment to make can be achieved based on, for example, the values of the phase difference and its complementary phase difference, and/or the delay unit(s) enabled. For example, if a determination that there is insufficient amount of enabled delay, then the phase difference can be adjusted. On the other hand, if there is sufficient amount of enabled delay, then the complementary phase difference can be adjusted. Regardless of which type of adjustment is made, various features of adaptive phase adjustment of the present disclosure can be implemented. For the purpose of description herein, "phase difference" may refer to the phase difference or the complementary phase difference as shown in the example of FIG. 9.

An initial clock signal 354 is shown to have a phase difference 380 relative to a reference phase 370 of the reference clock signal 352. Also shown is an initial configuration 390, where only En__2C is enabled.

Based on the phase difference 380, a "2C" shift 390 is effectuated during a first round of adaptive control sequence to yield a first adjusted clock signal 356 having a phase difference 382. Because the phase difference 382 is less than 2C but greater than 1C, En__2C is set to "0" and En__1C to "1" in an updated configuration 392.

Based on the phase difference 382, a "1C" shift 392 is effectuated during a second round of adaptive control sequence to yield a second adjusted clock signal 358 having a phase difference 384. Because the phase difference 384 is less than 1C but greater than HC, En__1C is set to "0" and En_HC to "1" in an updated configuration 394. At this stage, the example adjusted clock signal 358 is considered to be coarse locked with the reference clock signal 352.

Based on the phase difference 384, a "HC" shift 394 is effectuated during a third round of adaptive control sequence to yield a third adjusted clock signal 360 having a phase difference 386. Because the phase difference 386 is less than HC but greater than F, En_HC is set to "0" and En_FPD to "1" in an updated configuration 396.

Based on the phase difference 386, a "F" shift 396 is effectuated during a fourth round of adaptive control sequence to yield a fourth adjusted clock signal 362 having a phase difference 388. Because the phase difference 388 is less than F, the example adjusted clock signal 362 is considered to be fine locked with the reference clock signal 352.

As discussed above, similar phase locking can be achieved by adjusting the complementary phase difference 400. Such type of adjustment can be performed when the initial complementary phase difference (400) is less than the initial phase difference (380), and/or when there are appropriate delays already enabled. For example, if the FPD delay remains enabled after the previous phase lock, and the complementary phase difference is relatively small, FPD delay(s) can be removed to adjust the complementary phase difference so as to achieve phase lock. In another example, if the relatively larger delays 2C and 1C are already disabled (with HC and FPD remaining enabled), and the complementary phase difference is larger than the previous example, HC and FPD delay(s) can be removed to adjust the complementary phase difference so as to achieve phase lock.

In some embodiments, the largest of the plurality of delay values (for example, "2C" being the largest among 2C, 1C, HC, and FPD in the examples of FIGS. 8 and 9) can be selected based on observations and/or simulations of a given device. By way of example, Table 1 shows simulation results for various timing parameters at difference operating conditions for an example DLL circuit in a DDRIII V48A DRAM device.

TABLE 1

| Counts:<br>41 tCK<br>frequencies | 1.2 V, SS,<br>110° C. | 1.4 V, TT,<br>85° C. | 1.7 V, FF,<br>−40° C. | 1.4 V, FS,<br>85° C. | 1.4 V, SF,<br>85° C. |
|---|---|---|---|---|---|
| Average Phase difference (ps) | 551.6 | 337.3 | 199.0 | 329.6 | 330.6 |
| Average Coarse delay (ps) | 298.2 | 180.1 | 96.3 | 178.5 | 184.1 |
| Average phase difference/ 2 * (Average Coarse delay) | 0.92 | 0.94 | 1.03 | 0.92 | 0.90 |

As shown in Table 1, many of the average phase differences are within a window of 2*(Average Coarse delay). For example, in four of the five example operating conditions, the average phase difference is within the window. In the example operating condition of (1.7V, FF, −40° C.), the phase difference is outside of the window. Studies have shown that there can be a significant percentage (about 30 to 45%) of operating conditions where the average phase difference can be outside of the window. Thus, in the example device that is likely to operate in conditions where there is a significant likelihood of the initial phase difference to be outside of the example 2C window, the example 2C delay value can be selected as the largest delay value.

As seen in the example of Table 1, the average "fixed" delay value can change with changes in the operating condition. Thus, for the purpose of description herein, "fixed" will be understood to mean a generally constant value at a given operating condition.

Based on the foregoing description, one can see that phase locking procedure utilizing some or all features of the present disclosure can reduce the time required to achieve a lock. Such reduced time requirement can improve utilization of forward path timing budget for operation of devices such as memory devices. Moreover, faster locking can also reduce the power consumption by adaptively enabling various circuits under different enable signals.

In some embodiments, various processes described herein can be implemented in one or more processors. In general, it will be appreciated that the processors can include, by way of example, computers, program logic, or other substrate configurations representing data and instructions, which operate as described herein. In other embodiments, the processors can include controller circuitry, processor circuitry, processors, general purpose single-chip or multi-chip microprocessors, digital signal processors, embedded microprocessors, microcontrollers and the like.

Furthermore, it will be appreciated that in one embodiment, the program logic may advantageously be implemented as one or more components. The components may advantageously be configured to execute on one or more processors. The components include, but are not limited to, software or hardware components, modules such as software modules, object-oriented software components, class components and task components, processes methods, functions, attributes, procedures, subroutines, segments of program code, drivers, firmware, microcode, circuitry, data, databases, data structures, tables, arrays, and variables.

Although the above-disclosed embodiments have shown, described, and pointed out the fundamental novel features of the invention as applied to the above-disclosed embodiments, it should be understood that various omissions, substitutions, and changes in the form of the detail of the devices, systems, and/or methods shown may be made by those skilled in the art without departing from the scope of the invention. Consequently, the scope of the invention should not be limited to the foregoing description, but should be defined by the appended claims.

What is claimed is:

1. A method for phase-locking a clock signal to a reference signal in a delay-lock loop, the method comprising:
    obtaining a phase difference between a clock signal and a reference signal during a phase comparison cycle; and
    shifting the phase of the clock signal by a collective amount such that a locking of the clock signal occurs during the phase comparison cycle, the collective amount based at least in part on the obtained phase difference and a plurality of delay adjustments, each delay adjustment associated with an enable status, a delay adjustment value and a phase adjustment window, the collective amount determined by iteratively shifting the clock signal by the delay adjustment value when the delay adjustment is enabled and a phase difference is outside the phase adjustment window, and updating the phase difference and the enable status based on the shifting for each delay adjustment.

2. The method of claim 1 further comprising updating a control logic based on the updated enable status of each delay adjustment.

3. The method of claim 2 wherein the collective amount is further determined by detecting an increased phase difference and increasing the delay adjustment value based at least in part on the increased phase difference.

4. The method of claim 2 wherein the collective amount is further determined by applying the largest delay adjustment value that does not over compensate for the phase difference between the clock signal and the reference signal.

5. The method of claim 1 further comprising providing a control logic having the enable status for each of the plurality of delay adjustments.

6. The method of claim 1 wherein each delay adjustment includes one or more coarse delay adjustment values followed by one or more fine delay adjustment values.

7. The method of claim 1 wherein the plurality of delay adjustments includes at least one delay adjustment comprising one or more coarse delay adjustment values followed by one or more half-coarse delay adjustment values and at least one delay adjustment comprising one or more fine delay adjustment values.

8. The method of claim 1 wherein the plurality of delay adjustments includes at least one delay adjustment comprising one or more coarse delay adjustment values and at least one delay adjustment comprising one or more fine delay adjustment values.

9. The method of claim 1 wherein the method is performed during an initialization stage of a memory device.

10. A phase-locking system, comprising:
computer hardware including at least one processor; and
computer-readable storage including computer-readable instructions that, when executed by the processor, cause the computer hardware to perform operations defined by the computer-executable instructions, the computer-executable instructions including:
obtaining a phase difference between a clock signal and a reference signal during a phase comparison cycle; and
shifting the phase of the clock signal by a collective amount of delay such that a locking of the clock signal occurs during the phase comparison cycle, the collective amount of delay based at least in part on the obtained phase difference and a plurality of delay adjustments, each delay adjustment associated with an enable status, a delay adjustment value and a phase adjustment window, the collective amount of delay determined by iteratively shifting the clock signal by the delay adjustment value when the delay adjustment is enabled and a phase difference is outside the phase adjustment window, and updating the phase difference and the enable status based on the shifting for each delay adjustment.

11. The system of claim 10 wherein the computer-executable instructions further include updating a control logic for a next delay adjustment cycle based on the updated enable status of each delay adjustment.

12. The system of claim 10 further comprising a control logic configured to store the enable status for each of the plurality of delay adjustments during a plurality of delay adjustment cycles.

13. The system of claim 10 further comprising a delay adjustment component configured to apply the collective amount of delay to the clock signal.

14. The system of claim 10 further comprising an error detection and correction component configured to detect an increased phase difference and increase the delay adjustment value based at least in part on the increased phase difference.

15. A memory device comprising:
a phase detection component configured to determine a phase difference between a clock signal and a reference signal during a phase comparison cycle;
a decision component in communication with a control logic having an enable status, a delay adjustment value and a phase adjustment window for each of a plurality of delay adjustments during a plurality of delay adjustment cycles, the decision component configured to adaptively determine a collective amount of delay to be applied to the clock signal based on the obtained phase difference and the plurality of delay adjustments until locking of the clock signal occurs during the phase comparison cycle, the adaptively determined collective amount of delay determined by iteratively shifting the clock signal by the delay adjustment value when the delay adjustment is enabled and a phase difference is outside the phase adjustment window, and updating the phase difference and the enable status based on the shifting for each delay adjustment; and
a control component configured to control the phase detection component and the decision component so as to effectuate the adaptively determined collective amount of delay, the control component further configured to update a delay-locked loop based on the adaptively determined collective amount of delay during the phase comparison cycle.

16. The memory device of claim 15 further comprising a delay component configured to apply the adaptively determined collective amount of delay to the clock signal.

17. The memory device of claim 16 further comprising a feedback component configured to receive the delayed clock signal and determine a new phase difference between the delayed clock signal and the reference signal.

18. The memory device of claim 16 wherein the delay component comprises a delay buffer configured to apply a multiple of a delay unit based on the adaptively determined collective amount of delay.

19. The memory device of claim 15 further comprising an error detection and correction component configured to detect an increased phase difference and increase the delay adjustment value based at least in part on the increased phase difference.

20. The memory device of claim 15 wherein the plurality of delay adjustments includes at least one delay adjustment comprising one or more coarse delay adjustment values and at least one delay adjustment comprising one or more fine delay adjustment values.

* * * * *